(12) United States Patent
Saitoh et al.

(10) Patent No.: US 9,613,824 B2
(45) Date of Patent: Apr. 4, 2017

(54) ETCHING METHOD

(71) Applicant: TOKYO ELECTRON LIMITED, Tokyo (JP)

(72) Inventors: Yusuke Saitoh, Miyagi (JP); Hironobu Ichikawa, Miyagi (JP); Isao Tafusa, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/150,937

(22) Filed: May 10, 2016

(65) Prior Publication Data

US 2016/0336191 A1    Nov. 17, 2016

(30) Foreign Application Priority Data

May 14, 2015  (JP) .................. 2015-098800
Oct. 21, 2015  (JP) .................. 2015-207301

(51) Int. Cl.
*H01L 21/311* (2006.01)
*H01L 27/11556* (2017.01)
*H01L 27/11582* (2017.01)

(52) U.S. Cl.
CPC .. *H01L 21/31116* (2013.01); *H01L 21/31144* (2013.01); *H01L 27/11556* (2013.01); *H01L 27/11582* (2013.01)

(58) Field of Classification Search
CPC ......... H01L 21/31116; H01L 21/31144; H01L 27/11556; H01L 27/11582
See application file for complete search history.

(56) References Cited

U.S. PATENT DOCUMENTS

2013/0059450 A1  3/2013 Le Gouil et al.

*Primary Examiner* — Nadine Norton
*Assistant Examiner* — Mahmoud Dahimene
(74) *Attorney, Agent, or Firm* — Studebaker & Brackett PC

(57) ABSTRACT

The etching method of one embodiment includes a first step of generating a plasma of a first processing gas containing a fluorocarbon gas and a hydrofluorocarbon gas in a processing container of a plasma processing apparatus, and a second step of generating a plasma of a second processing gas containing a hydrofluorocarbon gas and a nitrogen gas in the processing container. In the method, sequences each including the first step and the second step are performed. The plasma is continuously generated over the execution period for the first step and the execution period for the second step. In the second step, a ratio of the flow rate of a hydrogen gas to the flow rate of the second processing gas is set to be small in a period immediately before the execution period for the first step and a period immediately after the execution period for the first step.

15 Claims, 9 Drawing Sheets

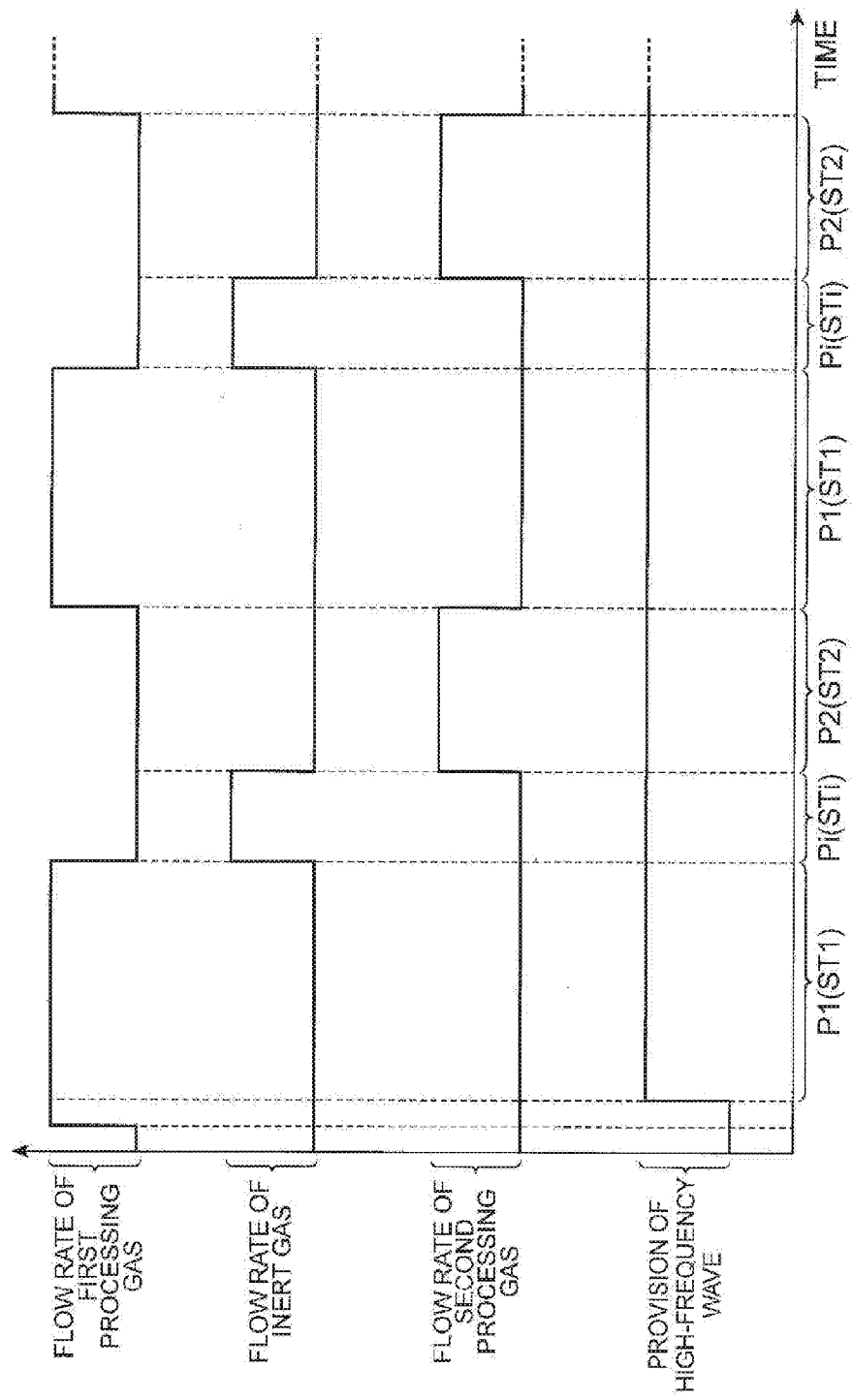

ETCHING METHOD

CROSS-REFERENCE TO RELATED APPLICATIONS

This application is based on and claims the benefit of priority from Japanese Patent Application Nos. 2015-098800 and 2015-207301 filed on May 14, 2015 and Oct. 21, 2015, respectively, and the entire contents of which are incorporated herein by reference.

BACKGROUND

Field

Exemplary Embodiments of the present disclosure relate to an etching method, in particular, to a method of simultaneously etching a first region and a second region, the first region including a multi-layer film configured by alternately stacking silicon oxide films and silicon nitride films, and the second region including a silicon oxide film having a film thickness thicker than the film thickness of the silicon oxide films in the first region.

Related Background Art

As one type of a semiconductor device, a NAND type flash memory device having a three-dimensional structure is known. In manufacture of the NAND type flash memory device having a three-dimensional structure, etching of a multi-layer film configured by alternately stacking silicon oxide films and silicon nitride films is performed to form a deep hole in the multi-layer film. Such etching is described in U.S. Patent Application Publication No. 2013/0059450.

Specifically, in U.S. Patent Application Publication 2013/0059450, a method of etching the multi-layer film by exposing a workpiece which includes a mask on the multi-layer film to plasma of a processing gas is described.

SUMMARY

In one aspect, there is provided a method of simultaneously etching a first region and a second region of a workpiece. The first region includes a multi-layer film in which silicon oxide films and silicon nitride films are alternately stacked. The second region includes a silicon oxide film having a film thickness thicker than a film thickness of the silicon oxide films in the first region. The workpiece includes a mask providing openings on the first region and the second region. The method includes (i) a first step of generating a plasma of a first processing gas which contains a fluorocarbon gas and a hydrofluorocarbon gas, in a processing container of a plasma processing apparatus in which the workpiece is prepared, and (ii) a second step of generating a plasma of a second processing gas which contains a hydrofluorocarbon gas and a nitrogen gas, in the processing container. In the method, a plurality of sequences each of which includes the first step and the second step are performed. That is, the first step and the second step are alternately repeated. In the method, the first step and the second step are consecutively performed. In the method, an execution period for the second step includes a first period including a start point of the second step, a second period subsequent to the first period, and a third period which is subsequent to the second period and includes an end point of the second step. The second processing gas further contains a hydrogen gas in the second period. A ratio of a flow rate of the hydrogen gas to a flow rate of the second processing gas in the first period immediately after an execution period for the first step and the third period immediately before the execution period for the first step is set to be smaller than the ratio of the flow rate of the hydrogen gas to the flow rate of the second processing gas in the second period.

In another aspect, there is provided a method of simultaneously etching the first region and the second region of the above-described workpiece. This method includes a first step of generating a plasma of a first processing gas which contains a fluorocarbon gas and a hydrofluorocarbon gas, in a processing container of a plasma processing apparatus in which the workpiece is prepared, and a second step of generating a plasma of a second processing gas which contains a hydrofluorocarbon gas, a nitrogen gas, and a hydrogen gas, in the processing container. In the method, a plurality of sequences each of which includes the first step and the second step are performed. Each of the plurality of sequences further includes between the first and second steps an intermediate step of generating a plasma of an inert gas which contains a helium gas, in the processing container.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

FIG. 9 is a diagram illustrating an example of a timing chart relating to the method illustrated in FIG. 8.

DETAILED DESCRIPTION

Figure 1:
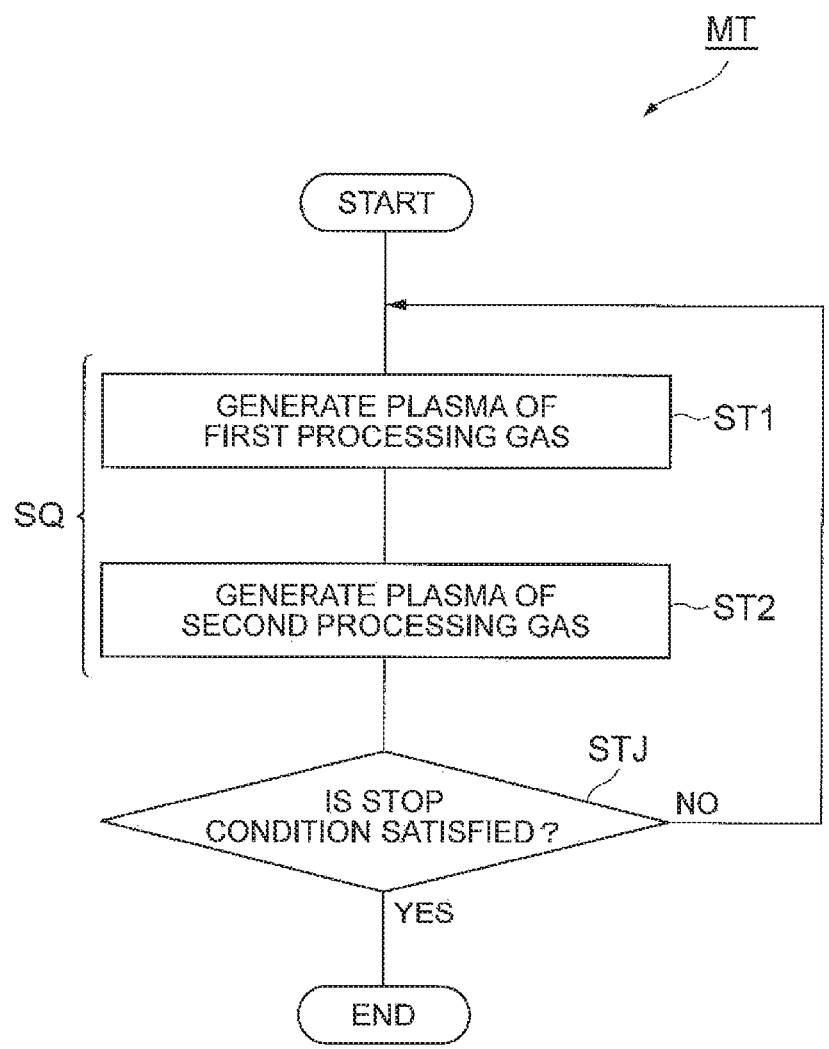
FIG. 1 is a flowchart illustrating an etching method according to an exemplary embodiment.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

As a workpiece which is a target of etching, there exists a workpiece including a first region and a second region. The first region includes a multi-layer film configured by alternately stacking silicon oxide films and silicon nitride films. The second region includes a silicon oxide film having a film thickness thicker than the film thickness of the silicon oxide films in the first region. It is required to perform etching of such a workpiece to simultaneously form spaces, such as holes and/or trenches, in both of the first region and the second region.

As a method of simultaneously forming spaces in the first region and the second region, the following method is conceivable. That is, a workpiece which includes a mask providing openings on both of the first region and the second region is prepared. A plasma of a processing gas containing a fluorocarbon gas and a hydrofluorocarbon gas is then generated in a processing container of a plasma processing apparatus to etch the first region and the second region.

However, in the etching in which the plasma of such a processing gas is used, a width of a space flamed in the second region may be widened at a portion of the space in a depth direction thereof. That is, verticality of a side wall surface defining the space which is formed by etching the second region may be deteriorated.

In order to suppress deterioration of the verticality of the side wall surface, a method of alternately repeating a first step and a second step is conceivable. In the first step, a plasma of a first processing gas containing a fluorocarbon gas and a hydrofluorocarbon gas is generated in a processing container of a plasma processing apparatus. In the second step, a plasma of a second processing gas containing a hydrogen gas, a hydrofluorocarbon gas, and a nitrogen gas is generated in the processing container. With this method, it is possible to perform etching to proceed with protection of a sidewall defining the space, using carbon and/or hydrocarbon which are generated from the second processing gas.

As described above, in the method of alternately repeating the first step and the second step, when the first step and the second step are consecutively performed, a period during which a plasma is generated in a state where the first processing gas and the second processing gas are mixed occurs. Thus, surplus deposition may be formed on the mask, and the width of the openings of the mask may become narrower. In some cases, the openings of the mask may be clogged. Accordingly, spaces having high verticality cannot be formed in the first region and the second region.

As a countermeasure for avoiding generation of a plasma in a state where the two processing gases which are respectively used in the two steps are mixed, a countermeasure is conceivable that a gas replacement period is provided between execution periods of the two steps. In the gas replacement period, a processing gas in the processing container is replaced with a processing gas used in the next step without generation of a plasma. A plasma is then generated after elapse of the gas replacement period. However, the gas replacement period, that is, a period during which a plasma is not generated causes deterioration of throughput.

Accordingly, in the technology of simultaneously etching the first region including a multi-layer film in which silicon oxide films and silicon nitride films are alternately stacked, and the second region including a silicon oxide film having a film thickness thicker than the film thickness of the silicon oxide films in the first region, it is desired to consecutively perform a first step of generating a plasma of a first processing gas and a second step of generating a plasma of a second processing gas, and suppress deterioration of the verticality of side wall surfaces formed by etching.

In one aspect, there is provided a method of simultaneously etching a first region and a second region of a workpiece. The first region includes a multi-layer film in which silicon oxide films and silicon nitride films are alternately stacked. The second region includes a silicon oxide film having a film thickness thicker than a film thickness of the silicon oxide films in the first region. The workpiece includes a mask providing openings on the first region and the second region. The method includes (i) a first step of generating a plasma of a first processing gas which contains a fluorocarbon gas and a hydrofluorocarbon gas, in a processing container of a plasma processing apparatus in which the workpiece is prepared, and (ii) a second step of generating a plasma of a second processing gas which contains a hydrofluorocarbon gas and a nitrogen gas, in the processing container. In the method, a plurality of sequences each of which includes the first step and the second step are performed. That is, the first step and the second step are alternately repeated. In the method, the first step and the second step are consecutively performed. In the method, an execution period for the second step includes a first period including a start point of the second step, a second period subsequent to the first period, and a third period which is subsequent to the second period and includes an end point of the second step. The second processing gas further contains a hydrogen gas in the second period. A ratio of a flow rate of the hydrogen gas to a flow rate of the second processing gas in the first period immediately after an execution period for the first step and the third period immediately before the execution period for the first step is set to be smaller than the ratio of the flow rate of the hydrogen gas to the flow rate of the second processing gas in the second period. In one embodiment, a high-frequency wave for generating a plasma is continuously used over the execution period for the first step and the execution period for the second step.

The basic principles of etching in the method according to the aspect are as follows. That is, the first step is performed to etch both of the first region and the second region. In the second step, fluorine generated by dissociating the hydrofluorocarbon gas is bonded to hydrogen, and thus the amount of fluorine is reduced. Carbon, hydrocarbon, fluorine-containing hydrocarbon, and the like which are generated from hydrofluorocarbon adhere to side wall surfaces defining spaces which are formed by the etching. Thus, the side wall surfaces formed by etching are protected. In addition, the amount of carbon and/or hydrocarbon adhering to the mask is reduced by active species of nitrogen. According to the method, clogging of the openings of the mask is suppressed and verticality of the side wall surfaces formed by the etching, particularly, the side wall surface formed by etching the second region is improved.

In the method according to the aspect, the first step and the second step are consecutively performed without providing a period for replacement of a gas during which a plasma is not generated. Thus, throughput is improved. In the first period immediately after the execution period for the first step and the third period immediately before the execution period for the first step, the ratio of the flow rate of the hydrogen. gas to the flow rate of the second processing gas is set to be small. Accordingly, the amount of the hydrogen gas mixed into the first processing gas is reduced. As a result, reduction of the amount of fluorine generated from the first processing gas is suppressed. In addition, excessive generation of hydrocarbon and fluorine-containing hydrocarbon which may be deposited on the mask is suppressed. Accordingly, reduction of the size of the openings of the mask and/or clogging of the mask is suppressed. Therefore, deterioration of the verticality of side wall surfaces defining spaces formed in the first region and the second region is suppressed.

In one embodiment, the second processing gas may further contain a nitrogen gas in the first period immediately after the execution period for the first step and the third period immediately before the execution period for the first step. In the embodiment, the amount of the deposition on the mask is reduced by the active species of nitrogen.

In one embodiment, the flow rate of the hydrogen gas in the first period immediately after the execution period for the first step and the third period immediately before the execution period for the first step, may be set to be smaller than the flow rate of the hydrogen gas in the second period. Alternatively, in the first period immediately after the execution period for the first step and the third period immediately before the execution period for the first step, the ratio of the flow rate of the hydrogen gas to the flow rate of the second processing gas may be set to be small by dilution with nitrogen gas.

In one embodiment, the execution period for the first step includes a fourth period including a start point of the first step, a fifth period subsequent to the fourth period, and a sixth period which is subsequent to the fifth period and includes an end point of the first step. The first processing gas further contains an oxygen gas in the fifth period. A ratio of the flow rate of the oxygen gas to the flow rate of the first processing gas in the fourth period immediately after the execution period for the second step in at least a sequence among the plurality of sequences and in the sixth period immediately before the execution period for the second step in at least a sequence among the plurality of sequences may be set to be smaller than the ratio of the flow rate of the oxygen gas to the flow rate of the first processing gas in the fifth period. In the embodiment, the amount of the deposition on the mask can be adjusted by adjustment of time lengths of the forth period and the fifth period are adjusted, and thus the width of the openings of the mask can be adjusted.

In one embodiment, the first processing gas may further contain a nitrogen gas in the fourth period immediately after the execution period for the second step in at least a sequence among the plurality of sequences and in the sixth period immediately before the execution period for the second step in at least a sequence among the plurality of sequences. In the embodiment, the amount of the deposition on the mask is reduced by the active species of nitrogen.

In one embodiment, the flow rate of the oxygen gas in the fourth period immediately after the execution period for the second step in at least a sequence among the plurality of sequences and in the sixth period immediately before the execution period for the second step in at least a sequence among the plurality of sequences may be set to be smaller than the flow rate of the oxygen gas in the fifth period. Alternatively, in the fourth period immediately after the execution period for the second step in at least a sequence among the plurality of sequences and in the sixth period immediately before the execution period for the second step in at least a sequence among the plurality of sequences, the ratio of the flow rate of the oxygen gas to the flow rate of the first processing gas may be set to be small by dilution with nitrogen gas.

In one embodiment, the first processing gas may further contain a fluorine-containing gas in the fourth period immediately after the execution period for the second step in at least a sequence among the plurality of sequences and in the sixth period immediately before the execution period for the second step in at least a sequence among the plurality of sequences. According to the embodiment, it is possible to adjust the amount of the deposition on the mask, and to increase an etching rate.

In one embodiment, the time length of the execution period for the first step may be set to be longer than the time length of the execution period for the second step. The second step is mainly used for protecting the side wall surfaces, and thus contribution of the second step to the etching is relatively small. According to the embodiment, since the time length of the execution period for the second step which contributes to protection of the side wall surfaces is set to be shorter than the time length of the execution period for the first step which contributes to the etching, throughput of the etching of the first region and the second region is increased.

In another aspect, there is provided a method of simultaneously etching the first region and the second region of the above-described workpiece. This method includes a first step of generating a plasma of a first processing gas which contains a fluorocarbon gas and a hydrofluorocarbon gas, in a processing container of a plasma processing apparatus in which the workpiece is prepared, and a second step of generating a plasma of a second processing gas which contains a hydrofluorocarbon gas, a nitrogen gas, and a hydrogen gas, in the processing container. In the method, a plurality of sequences each including the first step and the second step are performed. Each of the plurality of sequences further includes between the first step and the second step an intermediate step of generating a plasma of an inert gas which contains a helium gas, in the processing container. In each of the sequences, the first step, the intermediate step, and the second step are consecutively performed. In one embodiment, a high-frequency wave for generating a plasma is continuously used over the plurality of sequences. In this method, the principles of the etching are similar to the principles of the etching in the method according to the above-described aspect. In this method, a period for generating a plasma of an inert gas is provided between the first step and the second step without providing a period for replacement of a gas during which a plasma is not generated, and thus generation of a plasma in a state where the first processing gas and the second processing gas are mixed is prevented. Thus, excessive generation of the deposition on the mask is suppressed. Therefore, according to this method, reduction of the size of the openings of the mask and/or clogging of the mask is suppressed, and the verticality of the side wall surfaces formed by the etching, particularly, the side wall surface formed by etching the second region is improved. The inert gas may further include a nitrogen gas.

In one embodiment, the second processing gas may further contain a nitrogen trifluoride gas. The nitrogen trifluoride gas may contribute to adjustment of the etched amount of the mask, and the amount of the hydrocarbon. In one embodiment, the second processing gas may further contain a carbonyl sulfide gas. A product which contains sulfur (S) generated by dissociation of the carbonyl sulfide gas may contribute to protection of the mask and to adjustment of the width of the openings in the mask. In one embodiment, the second processing gas may further contain a hydrocarbon gas. The hydrocarbon gas may contribute as a hydrocarbon source for protecting the side wall surfaces. In one embodiment, the mask may be a mask formed of carbon, for example, a mask formed of an amorphous carbon.

As described above, in the technology of simultaneously etching the first region including a multi-layer film in which silicon oxide films and silicon nitride films are alternately stacked, and the second region including a silicon oxide film having a film thickness thicker than the film thickness of the silicon oxide films in the first region, it is possible to consecutively perform the first step of generating a plasma of the first processing gas and the second step of generating a plasma of the second processing gas, and to suppress deterioration of the verticality of the side wall surfaces which are formed by etching.

Hereinafter, various exemplary embodiments will be described in detail with reference to the accompanying drawings. in the drawings, the same reference numerals will be given to the same portions or equivalent portions.

FIG. 1 is a flowchart illustrating an etching method according to an exemplary embodiment. The method MT illustrated in FIG. 1 is a method of etching both of a first region and a second region to form spaces such as holes or trenches. The method MT may be used, for example, in manufacturing a NAND flash memory which has a three-dimensional structure.

Figure 2:
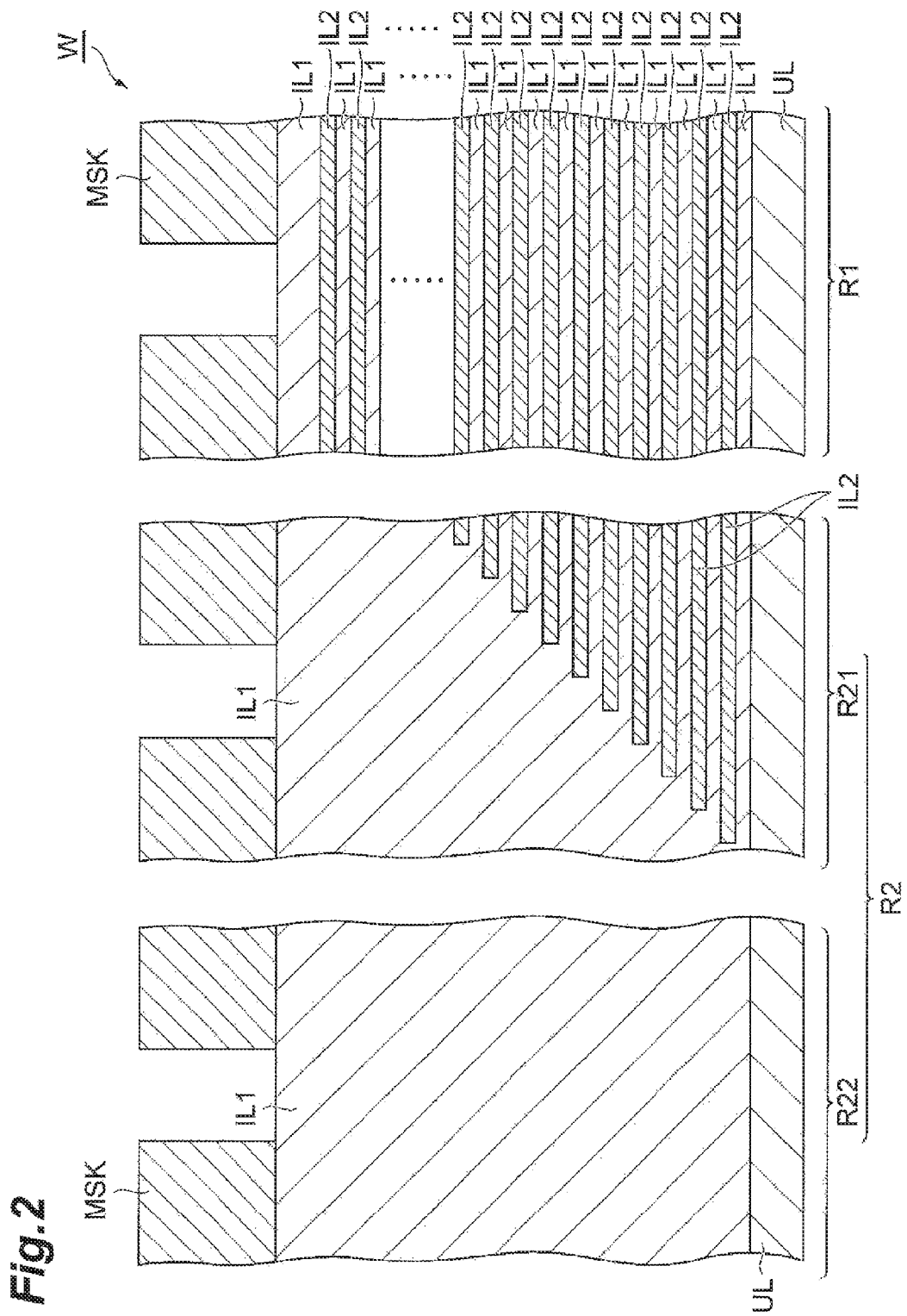
FIG. 2 is a sectional view illustrating a workpiece to which the etching method illustrated in FIG. 1 is applied.

FIG. 2 is a sectional view illustrating a workpiece to which the etching method illustrated in FIG. 1 is applied. The workpiece (referred to as "a wafer W" below) illustrated in FIG. 2 includes an underlying layer UL, a first region R1, a second region R2, and a mask MSK. The underlying layer UL may be, for example, a polycrystal silicon layer provided on a substrate. The first region R1 and the second region R2 are provided on the underlying layer UL.

The first region R1 is configured from a multi-layer film. The multi-layer film is configured in such a manner that silicon oxide films IL1 and silicon nitride films IL2 are alternately arranged. In the first region R1, the thickness of each of the silicon oxide films IL1 is, for example, 5 nm to 50 nm, and the thickness of each of the silicon nitride films IL2 is, for example, 10 nm to 75 nm. In an embodiment, in the first region R1, the silicon oxide films IL1 and the silicon nitride films IL2 of which the total number is equal to or greater than 24 may be stacked.

The second region R2 is a region including a silicon oxide film having a film thickness greater than the film thickness of each of the silicon oxide films IL1 in the first region R1. In one embodiment, the second region includes a partial region R21 and a partial region R22. Some of a plurality of silicon nitride films IL2 in the first region R1 are extended into the partial region R21 in a direction orthogonal to a stacking direction of the multi-layer film. As illustrated in FIG. 2, the plurality of silicon nitride films IL2 which are extended into the partial region. R21 from the first region R1 are terminated in the partial region R21, so as to form a stepwise shape. A portion other than the silicon nitride films 1L2 in the partial region R21. is formed from the silicon oxide film IL1. The partial region R22 is formed from the single-layer silicon oxide film IL1. The thickness of the second region R2 configured in this manner is substantially the same as the thickness of the first region R1.

The mask MSK is provided on the first region R1 and the second region R2. The mask MSK is formed with openings for forming spaces such as holes or trenches in the first region R1 and the second region R2. The mask MSK may be, for example, an amorphous carbon mask. Alternatively, the mask MSK may be formed from organic polymer.

Figure 3:
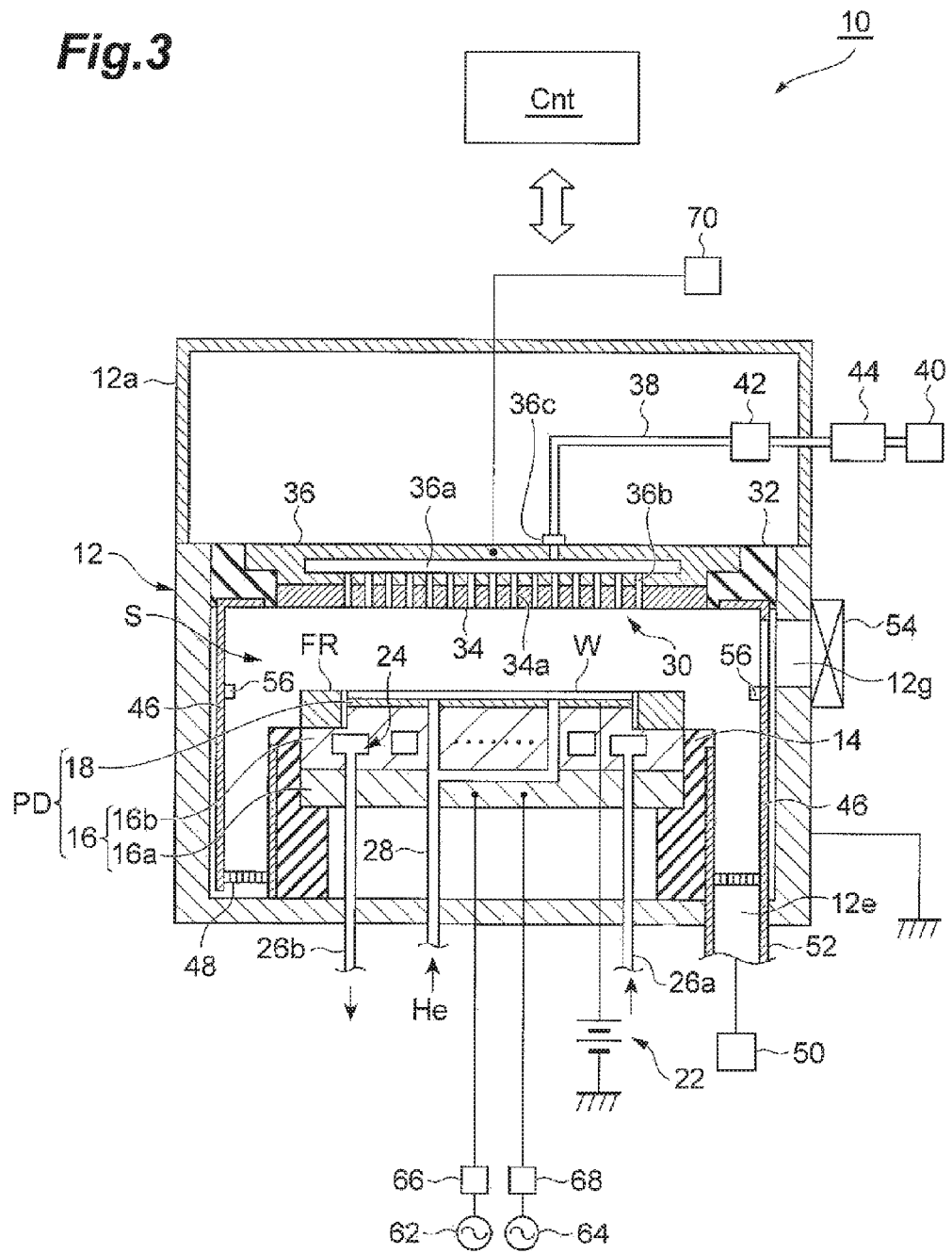
FIG. 3 is a schematic diagram illustrating an example of a plasma processing apparatus which can be used in performing the method illustrated in FIG. 1.

In the method MT, firstly, the wafer W as illustrated in FIG. 2 is prepared in a processing container of a plasma processing apparatus. FIG. 3 is a schematic diagram illustrating an example of the plasma processing apparatus which can be used in performing the method illustrated in FIG. 1.

A plasma processing apparatus 10 illustrated in FIG. 3 is a capacity coupling plasma etching apparatus. The plasma processing apparatus 10 includes a processing container 12 having a substantially-cylindrical shape. The processing container 12 is formed of, for example, aluminum. An inner wall surface of the processing container 12 is anodized. The processing container 12 is stably grounded. A passage 12g for carrying the wafer W in and out is provided in the sidewall of the processing container 12. The passage 12g can be opened or closed by a gate valve 54.

A substantially-cylindrical support portion 14 formed of an insulating material is provided on a bottom portion of the processing container 12. The support portion 14 is extended from the bottom portion of the processing container 12 in the processing container 12 in a vertical direction. The support portion 14 supports a mounting table PT) in the processing container 12.

The mounting table PD includes a lower electrode 16 and an electrostatic chuck 18. In an embodiment, the lower electrode 16 includes a first member 16a and a second member 16b. Both of the first member 16a and the second member 16b have a substantially disc shape, and are formed of a conductive material such as aluminum. The second member 16b is provided on the first member 16a and is electrically connected to the first member 16a.

A first high-frequency power source 62 is connected to the first member 16a through a matcher 66. The first high-frequency power source 62 is a power source that generates a high-frequency wave for generating plasma. The first high-frequency power source 62 generates a high-frequency wave having a frequency of 27 MHz to 100 MHz, for example, a frequency of 40 MHz. The matcher 66 has a circuit for matching output impedance of the first high-frequency power source 62 and input impedance on a load side (lower electrode 16 side). The first high-frequency power source 62 may be connected to an upper electrode 30 through the matcher 66.

A second high-frequency power source 64 is connected to the first member 16a through a matcher 68. The second high-frequency power source 64 is a power source that generates a high-frequency wave for attracting ions to the wafer W, that is, generates a high frequency bias. The second high-frequency power source 64 generates a high-frequency wave having a frequency in a range of 400 kHz to 13.56 MHz, for example, generates a high frequency bias having a frequency of 3 MHz. The matcher 68 is a circuit for matching output impedance of the second high-frequency power source 64 and input impedance on a load side (lower electrode 16 side).

A coolant passage 24 is formed in the second member 16b. A coolant is supplied to the coolant passage 24 from a chiller unit through a pipe 26a. The chiller unit is provided on the outside of the processing container 12. The coolant supplied to the coolant passage 24 is brought back into the chiller unit through a pipe 26b. Controlling the temperature of the coolant which is circulated in this manner enables the temperature of the wafer W mounted on the electrostatic chuck 18 to be controlled.

The electrostatic chuck 18 is provided on the second member 16b. The electrostatic chuck 18 has a structure in which a film electrode is disposed between a pair of insulating layers or insulating sheets. A. DC power source 22 is electrically connected to the electrode of the electrostatic chuck 18 through a switch. An electrostatic force is generated by a DC voltage which is applied by the DC power source 22. The electrostatic chuck 18 attracts a wafer W by using the electrostatic force such as the Coulomb force, and holds the attracted wafer W. A heating element such as a heater may be provided in the electrostatic chuck 18.

A focus ring FR is provided around the electrostatic chuck 18 and on the second member 16b. The focus ring FR is disposed so as to improve uniformity in etching. The focus ring FR is formed of, for example, quartz.

A gas feed line 28 is provided in the lower electrode 16 and the electrostatic chuck 18. The gas feed line 28 is configured to feed a heat transfer gas (for example, He gas) from a heat-transfer gas feed mechanism, to a space between the upper surface of the electrostatic chuck 18 and the back surface of the wafer W.

The plasma processing apparatus 10 includes an upper electrode 30. The upper electrode 30 is disposed above the mounting table PD to face the mounting table PD. The lower electrode 16 and the upper electrode 30 are provided to be substantially parallel with each other. A processing space S for performing a plasma processing on the wafer W is formed between the mounting table PD and the lower electrode 16.

The upper electrode 30 is supported on an upper portion of the processing container 12 via an insulating shielding member 32. The upper electrode 30 may include a ceiling plate 34 and a support 36. The ceiling plate 34 directly faces the processing space S, and provides a plurality of gas discharge holes 34a. The top board 34 may be formed of an electric conductor or a semiconductor which has small Joule heat and low resistance.

The support 36 detachably supports the ceiling plate 34. The support 36 is formed of for example, a conductive material such as aluminum. The support 36 may include a liquid cooling structure. A gas diffusion chamber 36a is provided in the support 36. A plurality of gas flow holes 36b which respectively, communicate with the gas discharge holes 34a is extended downwardly from the gas diffusion chamber 36a. A gas introduction port 36c for introducing a processing gas into the gas diffusion chamber 36a is formed in the support 36. A gas feeding pipe 38 is connected to the gas introduction port 36c.

A gas source group 40 is connected to the gas feeding pipe through a valve group 42 and a flow controller group 44. The gas source group 40 includes a plurality of gas sources. The plurality of gas sources includes a source of a fluorocarbon gas, a source of a hydrofluorocarbon gas, a source of a hydrogen gas ($H_2$ gas), and a source of a nitrogen gas ($N_2$ gas). In one embodiment, the plurality of gas sources may further include a source of an oxygen gas (0, gas), a source of a nitrogen trifluoride gas ($NF_3$ gas), a source of a carbonyl sulfide gas (COS gas), and a source of a hydrocarbon gas. As the fluorocarbon gas, for example, one or more fluorocarbon gases such as a $C_4F_6$ gas, a $C_4F_8$ gas, and a $CF_4$ gas may be used. As the hydrofluorocarbon gas, for example, a $CH_2F_2$ gas may be used. As the hydrocarbon gas, for example, a $CH_4$ gas may be used. The plurality of gas sources may further include, for example, a source of an arbitrary rare gas such as a He gas, a Ne gas, an Ar gas, or a Kr gas, a source of a boron trichloride gas ($BCl_3$ gas), and a source of a $SF_6$ gas.

The valve group 42 includes a plurality of valves. The flow controller group 44 includes a plurality of flow controllers such as massflow controllers (MFC). Each of the plurality of gas sources in the gas source group 40 is connected to the gas feeding pipe 38 through the corresponding flow controller of the flow controller group 44 and the corresponding valve of the valve group 42. In the plasma processing apparatus 10, a gas from the gas source selected from the plurality of gas sources reaches the gas diffusion chamber 36a from the gas feeding pipe 38, and is discharged to the processing space S through the gas flow holes 36b and the gas discharges hole 34a.

The plasma processing apparatus 10 further includes a DC power source 70. The DC power source 70 is connected to the upper electrode 30. The DC power source 70 may generate a negative DC voltage and apply the generated negative DC voltage to the upper electrode 30.

The plasma processing apparatus 10 may further include a ground conductor 12a. The ground conductor 12a has a substantially cylindrical shape and is provided to be extended from the sidewall of the processing container 12 above the top position of the upper electrode 30.

In the plasma processing apparatus 10, a deposit shield 46 is provided along the inner wall of the processing container 12, so as to be detachable to the processing container 12. The deposit shield 46 is also provided on an outer circumference of the support portion 14. The deposit shield 46 is used for prevent adhering of an etching byproduct (deposit) to the processing container 12. The deposit shield 46 may be formed by coating an aluminum material with ceramics such as $Y_2O_3$.

An exhaust plate 48 is provided between the support portion 14 and the inner wall of the processing container 12 on the bottom portion side of the processing container 12. The exhaust plate 48 may be formed, for example, by coating an aluminum material with ceramics such as $Y_2O_3$. The exhaust plate 48 is formed with multiple through holes. An exhaust port 12e is provided under the exhaust plate 48 in the processing container 12. An exhaust device 50 is connected to the exhaust port 12e through an exhaust pipe 52. The exhaust device 50 includes a pressure regulating valve, and a vacuum pump such as a turbomolecular pump. The exhaust device 50 may depressurize a space in the processing container 12 to desired pressure.

A conductive member (GND block) 56 is provided on the inner wall of the processing container 12. The conductive member 56 is attached to the inner wall of the processing container 12, so as to be placed at a position which is substantially the same as the height of the wafer W in a height direction. The conductive member 56 is connected to the ground with a direct current, and thus exhibits an abnormal discharge prevention effect. The conductive member 56 may be provided in a plasma generation area, and an installation position of the conductive member 56 is not limited to the position illustrated in FIG. 3.

The plasma processing apparatus 10 may further include a control unit Cnt. The control unit Cnt may be a computer device which includes a processor, a storage unit, an input device, a display device, and the like, and may control each of the units of the plasma processing apparatus 10. The control unit Cnt enables an operator to perform an input operation and the like of a command for managing the plasma processing apparatus 10 by using the input device. The display device enables an operation status of the plasma processing apparatus 10 to be visualized and displayed. In addition, the storage unit in the control unit Cnt stores a control program for causing the processor to control various processes performed in the plasma processing apparatus 10, and a program for causing each of the units in the plasma processing apparatus 10 to perform the various processes in accordance with processing conditions, that is, a processing recipe. In one embodiment, the control unit Cnt controls each of the units in the plasma processing apparatus 10 in accordance with a processing recipe created for performing the method MT.

In the plasma processing apparatus 10, a processing gas from a gas source selected from the plurality of gas sources in the gas sources group 40 is fed to the processing space S. The exhaust device 50 sets the pressure of the processing space S to a predetermined pressure. A high-frequency wave from the first high-frequency power source 62 is applied to the lower electrode 16, and a high frequency bias from the second high-frequency power source 64 is applied to the lower electrode 16. Thus, the processing gas is excited in the processing space S, and the plasma processing such as etching is performed on the wafer W by active species of radicals, ions, and the like.

Figure 4:
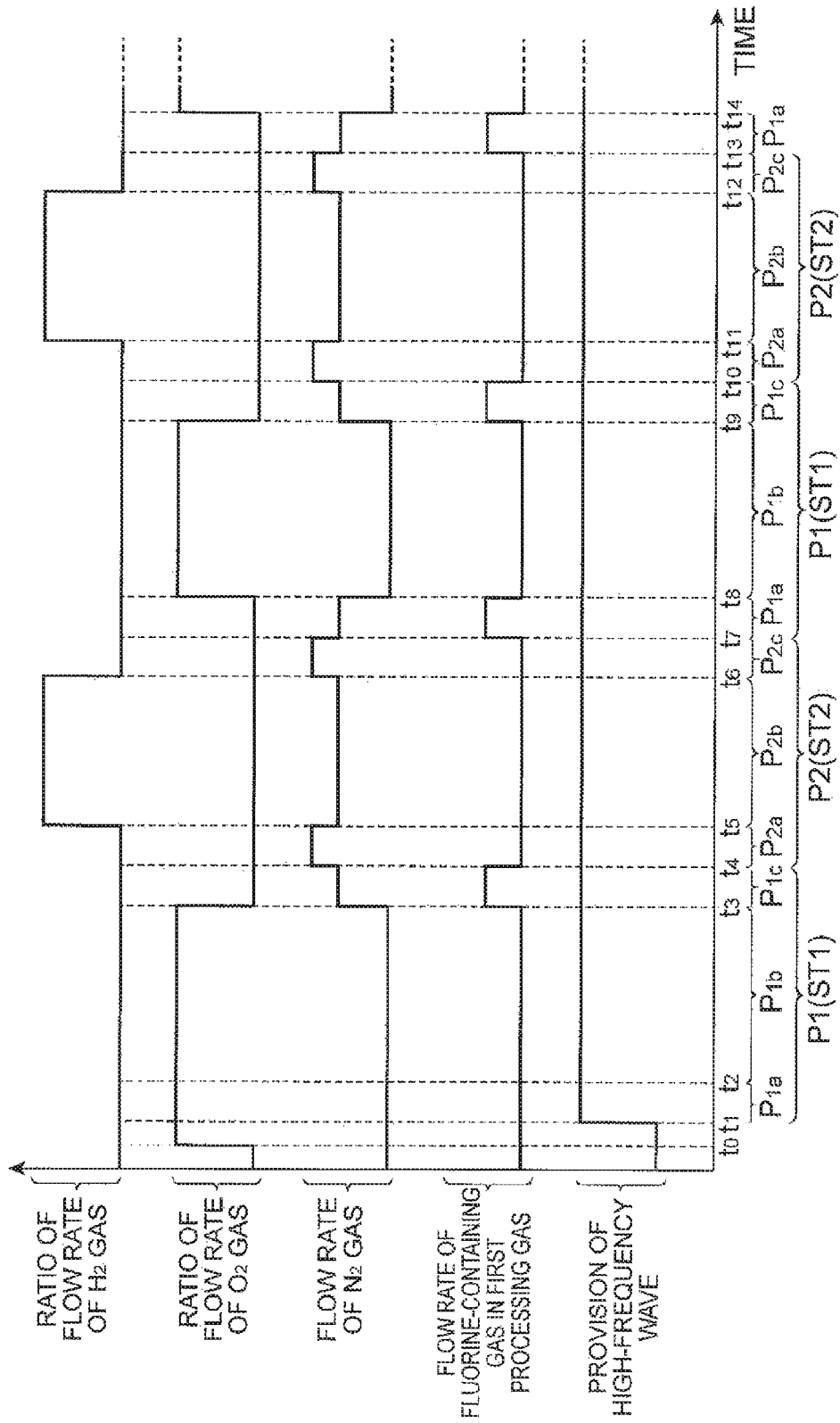
FIG. 4 is a diagram illustrating an example of a timing chart for several gases and a high-frequency wave in the method illustrated in FIG.
Figure 5:
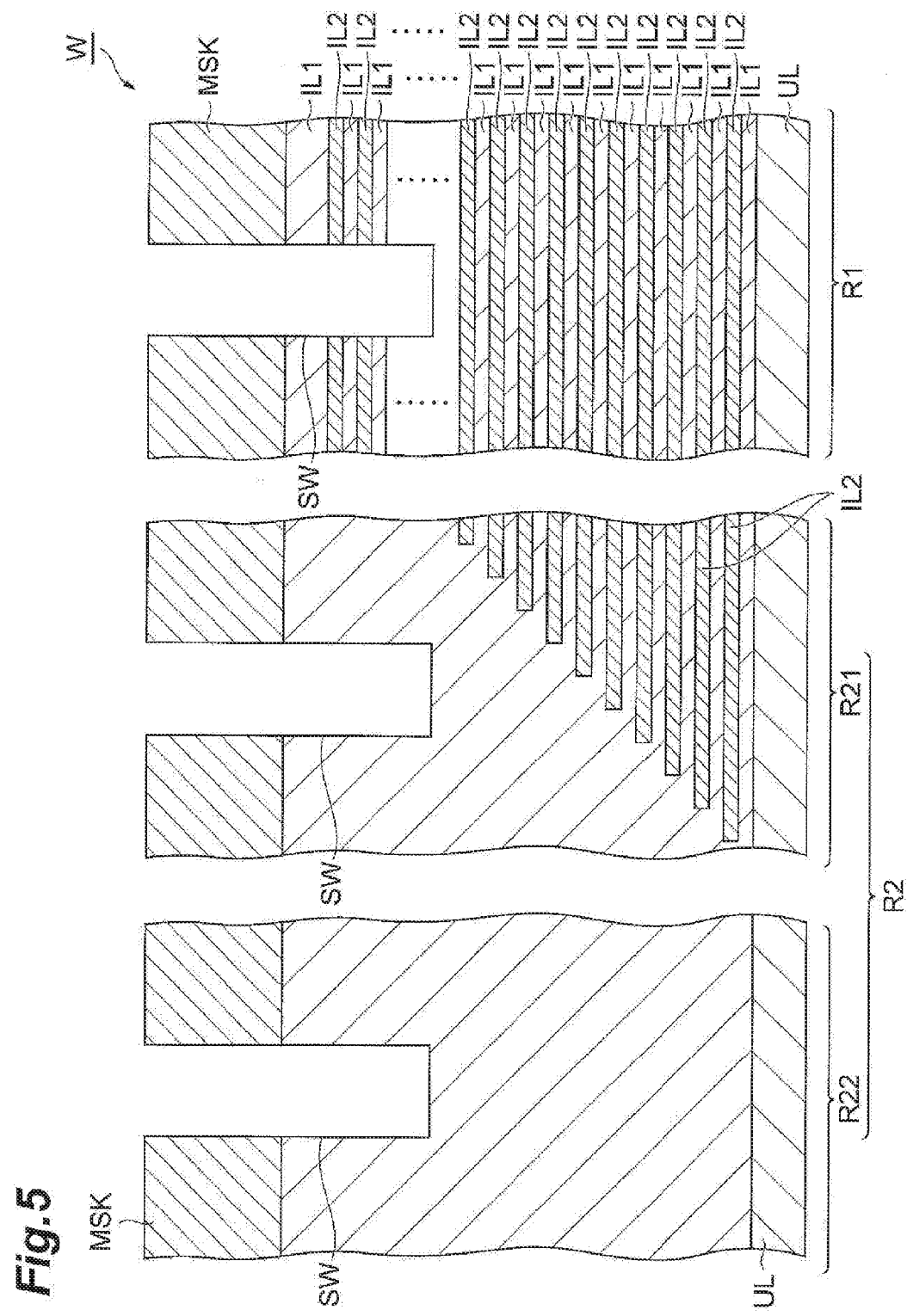
FIG. 5 is a sectional view illustrating an example of a state of the workpiece in middle of execution of the method illustrated in FIG. 1.
Figure 6:
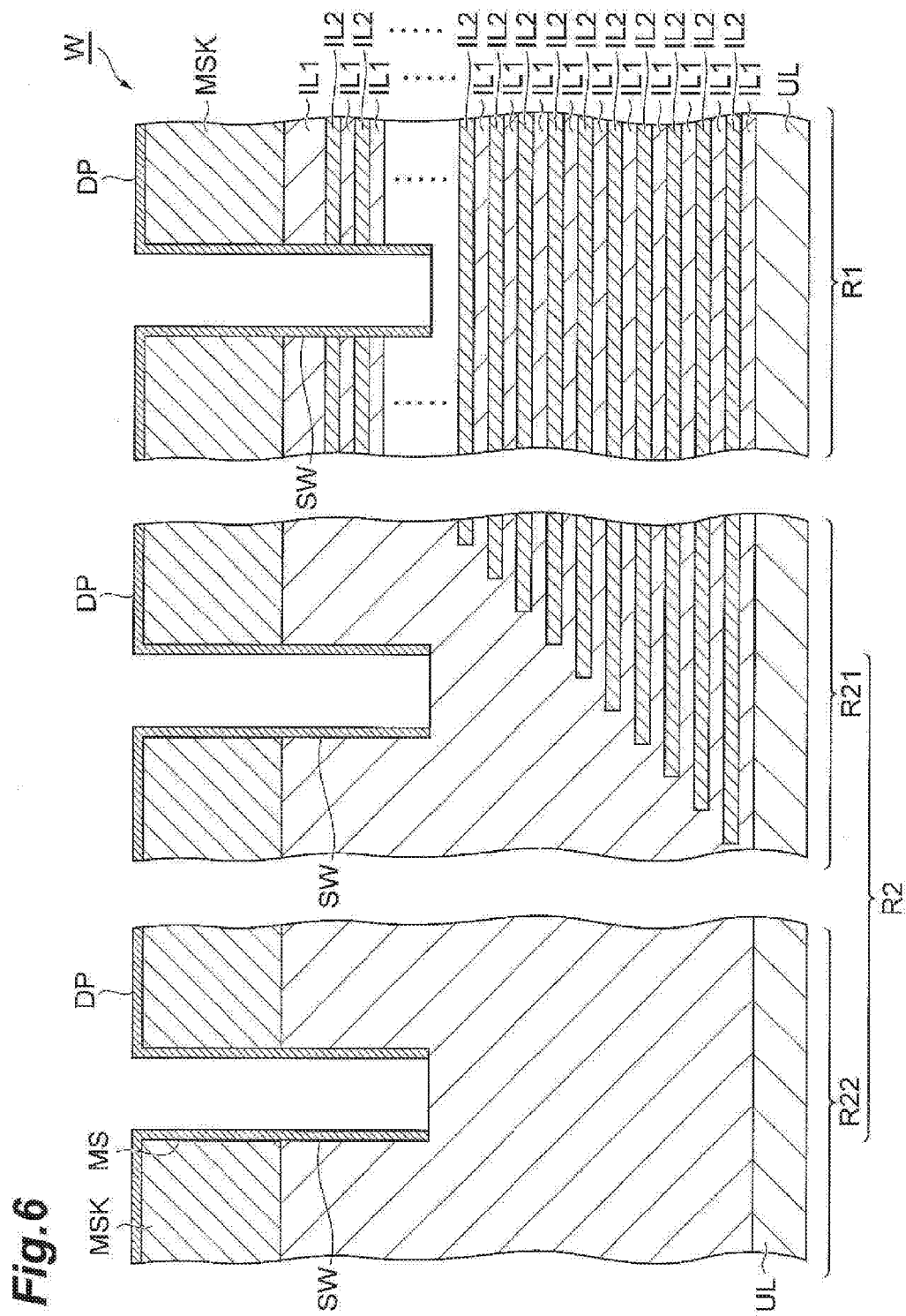
FIG. 6 is a sectional view illustrating an example of a state of the workpiece in middle of execution of the method illustrated in FIG. 1.
Figure 7:
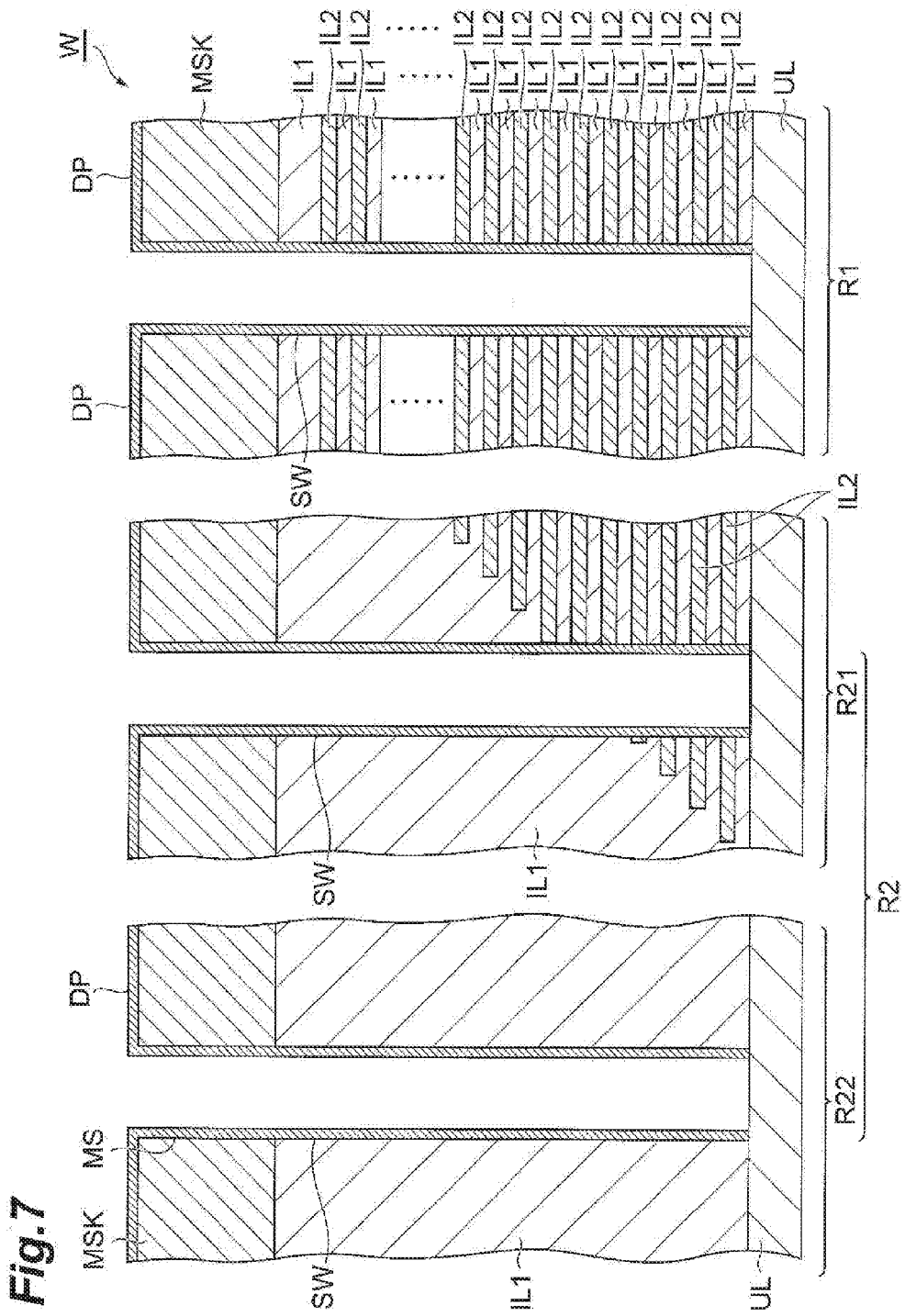
FIG. 7 is a sectional view illustrating an example of a state of the workpiece after execution of the method illustrated in FIG. 1.

The method MT will be continuously described with reference to FIG. 1. In the following descriptions, FIGS. 4 to 7 are referred along with FIG. 1. FIG. 4 is a diagram illustrating an example of a timing chart for several gases and high-frequency wave in the method illustrated in FIG. 1. A vertical axis in FIG. 4 indicates a ratio of a flow rate of the hydrogen gas ($H_2$ gas) to a flow rate of the second processing gas, a ratio of a flow rate of the oxygen gas ($O_2$ gas) to a flow rate of the first processing gas, a flow rate of the nitrogen gas ($N_2$ gas), and a flow rate of the fluorine-containing gas in the first processing gas. The vertical axis in FIG. 4 also indicates provision of the high-frequency wave. A high level in "provision of the high-frequency wave" indicates that the high-frequency wave is supplied. A low level in the "provision of the high-frequency wave" indicates that the high-frequency wave is not supplied. FIGS. 5 and 6 are sectional views illustrating an example of a state of the workpiece at in middle of execution of the method illustrated in FIG. 1. FIG. 7 is a sectional view illustrating an example of a state of the workpiece after execution of the method illustrated in FIG. 1. In the following descriptions, the method MT will be described by taking a. case of using the plasma processing apparatus 10, as an example.

As described above, in the method MT, firstly, a wafer W is carried into the processing container 12 of the plasma processing apparatus 10. The wafer W is placed on the mounting table PD and is held by the electrostatic chuck 18. In the method MT, a plurality of sequences SQ each of which includes a step ST1 and a step ST2 are performed in order. That is, the step ST1 and the step ST2 are alternately repeated.

In the step ST1, a plasma of the first processing gas is generated in the processing container 12. In the step ST2, a plasma of the second processing gas is generated in the processing container 12. In the method MT, the step ST1 and the step ST2 are consecutively performed. That is, the plasma is generated, even in a period during which the first processing gas used in the step ST1. and the second processing gas used in the step ST2 are mixed in the processing container 12. In one embodiment, the plasma is continuously generated over an execution period for the step ST1 and an, execution period for the step ST2. Specifically, as illustrated in FIG. 4, the high-frequency wave for generating the plasma. is continuously used. More specifically, in an embodiment using the plasma processing apparatus 10, the high-frequency wave is continuously applied to the lower electrode LE from the first high-frequency power source 62 over the execution period for the step ST1 and the execution period for the step ST2.

The first processing gas used in the step ST1 contains a fluorocarbon gas and a hydrofluorocarbon gas. In an example, the first processing gas may contain one or more fluorocarbon gases such as a $C_4F_6$ gas, a $C_4F_8$ gas, and a $CF_4$ gas, as the fluorocarbon gas. The first processing gas may contain a $CH_2F_2$ gas as the hydrofluorocarbon gas.

As illustrated in FIG. 4, the execution period P1 for the step ST1 each time includes, a period $P_{1a}$ (in FIG. 4, a time point $t_1$ to a time point $t_2$, a time point $t_7$ to a time point $t_8$, and a time point $t_{13}$ to a time point $t_{14}$), a period $P_{1b}$ (in FIG. 4, a time point $t_2$ to a time point $t_3$, and a time point $t_8$ to a time point $t_9$), and a period $P_{1c}$ (in FIG. 4, a time point $t_3$ to a time point $t_4$, and a time point $t_9$ to a time point $t_{10}$). The period $P_{1a}$ is a period including a start point of the step ST1. The period $P_{1b}$ is a period subsequent to the period $P_{1a}$. The period $P_{1c}$ is a period subsequent to the period $P_{1b}$, and includes an end point of the step ST1. Each of the period $P_{1a}$, the period $P_{1b}$, and the period $P_{1c}$ includes a predetermined time length. In one embodiment, the time length of the period $P_{1b}$ is set to be longer than the time lengths of the period $P_{1a}$ and the period $P_{1c}$.

In the period $P_{1b}$ for the step ST1, the first processing gas further contains an oxygen gas ($O_2$ gas). The ratio of the flow rate of the oxygen gas to the flow rate of the first processing gas in the period $P_{1a}$ (in FIG. 4, the time point $t_7$ to the time point $t_8$, and the time point $t_{13}$ to the time point $t_{14}$) immediately after the execution period P2 for the step ST2 and the period $P_{1c}$ (in FIG. 4, the time point $t_3$ to the time point $t_4$, and the time point $t_9$ to the time point $t_{10}$) immediately before the execution period P2 for the step ST2 is set to be smaller than the ratio of the flow rate of the oxygen gas to the flow rate of the first processing gas in the period $P_{1b}$.

In one embodiment, the flow rate of the oxygen gas in the period $P_{1a}$ immediately after the execution period P2 for the step ST2 and the period $P_{1c}$ immediately before the execution period P2 for the step ST2 is set to be smaller than the flow rate of the oxygen gas in the period $F_{1b}$ or set to be zero. In this embodiment, in the period $P_{1a}$ immediately after the execution period P2 for the step ST2 and the period $P_{1c}$ immediately before the execution period P2 for the step ST2, the first processing gas may contain a. nitrogen gas.

In another embodiment, the flow rate of the oxygen gas in the period $P_{1a}$ immediately after the execution period P2 for the step ST2 and the period $P_{1c}$ immediately before the execution period P2 for the step ST2 may be set to be substantially the same as the flow rate of the oxygen gas in the period $P_{1b}$. In this embodiment, in the period $P_{1a}$ immediately after the execution period P2 for the step ST2 and the period $P_{1c}$ immediately before the execution period P2 for the step ST2, the first processing gas further contain a nitrogen gas. Thus, in the period $P_{1a}$ immediately after the execution period P2 for the step ST2 and the period $P_{1c}$ immediately before the execution period P2 for the step ST2, the ratio of the flow rate of the oxygen gas to the flow rate of the first processing gas is set to be relatively small.

In one embodiment, in the period $P_{1a}$ immediately after the execution period P2 for the step ST2 and the period $P_{1c}$ immediately before the execution period P2 for the step ST2, a fluorine-containing gas is added to the first processing gas. The fluorine-containing gas is one or more gases among a $NF_3$ gas, a $CF_4$ gas, and a $SF_6$ gas, for example. In a case where the fluorine-containing gas added in the period $P_{1a}$ immediately after the execution period P2 for the step ST2 and the period $P_{1c}$ immediately before the execution period P2 for the step ST2 is the same as the fluorocarbon gas included in the first processing gas, the flow rate of the fluorocarbon gas is increased in the period $P_{1a}$ immediately after the execution period P2 for the step ST2 and the period $P_{1c}$ immediately before the execution period P2 for the step ST2.

In the step ST1, the first processing gas is fed into the processing container 12. In the step ST1, the ratio of the flow rate of the oxygen gas to the flow rate of the first processing gas fed into the processing container 12 is adjusted as described, above, in each of the period $P_{1a}$, the period $P_{1b}$, and the period $P_{1c}$. In the step ST1, the exhaust device 50 sets pressure of the processing space S to a predetermined pressure. In the step ST1, the high-frequency wave from the first high-frequency power source 62, and the high frequency bias from the second high-frequency power source 64 are supplied to the lower electrode 16.

In the step ST1, the first processing gas is excited, and the first region R1 and the second region R2 are etched at portions exposed from the mask MSK, as illustrated in FIG. 5, by generated active species of ions and/or radicals, for example. In the step ST1, deposition containing carbon, such as deposition of fluorocarbon and/or hydrocarbon, which is generated from the first processing gas, is formed on the wafer W. The generated deposition is appropriately removed by active species of oxygen, which are generated in at least the period $P_{1b}$. Accordingly, clogging of the openings in the mask MSK due to such deposition is suppressed.

The second processing gas used in the step ST2 contains a hydrofluorocarbon gas and a nitrogen gas ($N_2$ gas). As the hydrofluorocarbon gas of the second processing gas, for example, a $CH_2F_2$ gas is used. In one embodiment, the second processing gas may further include at least one of a nitrogen trifluoride gas ($NF_3$ gas), a carbonyl sulfide gas (COS gas), and a hydrocarbon gas.

As illustrated in FIG. 4, the execution period P2 for the step ST2 each time includes a period $P_{2a}$ (in FIG. 4, a time point $t_4$ to a time point $t_5$, and a time point $t_{1r}$) to a time point $t_{11}$), a period $P_{2b}$ (in FIG. 4, a time point $t_5$ to a time point $t_6$, and a time point $t_{11}$ to a time point $t_{12}$), and a period $P_{2c}$ (in FIG. 4, a time point $t_6$ to a time point $t_7$, and a time point $t_{12}$ to a time point $t_{13}$). The period $P_{2c}$ is a period including a start point of the step ST2. The period $P_{2b}$ is a period subsequent to the period $P_{2a}$. The period $P_{2c}$ is a period subsequent to the period $P_{2b}$, and includes an end point of the step ST2. Each of the period $P_{2a}$, the period $P_{2b}$, and the period $P_{2c}$ has a predetermined period length. In one embodiment, the time length of the period $P_{2b}$ is set to be longer than the time lengths of the period $P_{2a}$ and the period $P_{2c}$.

In the period $P_{2b}$ for the step ST2, the second processing gas further contains a hydrogen gas ($H_2$ gas). The ratio of flow rate of the hydrogen gas to the flow rate of the second processing gas in the period $P_{2a}$ immediately after the execution period P1 for the step ST1 and the period $P_{2c}$ immediately before the execution period P1 for the step ST1 is set to be smaller than the ratio of the flow rate of the hydrogen gas to the flow rate of the second processing gas in the period $P_{2b}$.

In one embodiment, the flow rate of the hydrogen gas in the period $P_{2a}$ immediately after the execution period P1 for the step ST1 and the period $P_{2c}$ immediately before the execution period P1 for the step ST1 is set to be smaller than the flow rate of the hydrogen gas in the period $P_{2b}$ or set to be zero. In this embodiment, in the period immediately after the execution period P1 for the step ST1 and the period $P_{2c}$ immediately before the execution period P1 for the step ST1, the second processing gas may include a nitrogen gas.

In another embodiment, the flow rate of the hydrogen gas in the period $P_{2a}$ immediately after the execution period P1 for the step ST1 and the period $P_{2c}$ immediately before the execution period P1 for the step ST1 may be set to be substantially the same as the flow rate of the hydrogen gas in the period $P_{2b}$. In this embodiment, in the period $P_{2a}$ immediately after the execution period P1 for the step ST1 and the period $P_{2c}$ immediately before the execution period P1 for the step ST1, the second processing gas includes the nitrogen gas. Thus, in the period $P_{2a}$ immediately after the execution period P1 for the step ST1 and the period $P_{2c}$ immediately before the execution period P1 for the step ST1, the ratio of the flow rate of the hydrogen gas to the flow rate of the second processing gas is set to be relatively small.

In the step ST2, the second processing gas is fed to the processing container 12. In the step ST2, the ratio of the flow rate of the hydrogen gas to the total flow rate of the second processing gas fed into the processing container 12 is adjusted as described above, in each of the period $P_{2a}$, the period $P_{2b}$, and the period $P_{2c}$. In the step ST2, the exhaust device 50 sets pressure of the processing space S to a predetermined pressure. In the step ST2, the high-frequency wave from the first high-frequency power source 62, and the high frequency bias from the second high-frequency power source 64 are supplied to the lower electrode 16.

In the step ST2, the second processing gas is excited. Hydrofluorocarbon in the second processing gas is dissociated into fluorine, hydrogen, carbon, hydrocarbon, and the like. Fluorine generated by dissociating hydrofluorocarbon is bonded to hydrogen generated by dissociating the hydrogen gas in the period $P_{2b}$. Accordingly, in the step ST2, the amount of fluorine which contributes to etching is reduced. Carbon and/or hydrocarbon which are generated by dissociating hydrofluorocarbon adhere to side wall surfaces SW which define spaces formed by etching, and a surface MS of the mask MSK. Thus, deposition DP is formed as illustrated in FIG. 6.

Accordingly, the side wall surfaces SW are protected. In addition, the width of the openings provided by the mask MSK is adjusted. The amount of carbon and/or hydrocarbon adhering to the surface MS of the mask MSK is greater than the amount of carbon and/or hydrocarbon adhering to the side wall surfaces SW. However, carbon and/or hydrocarbon adhering to the surface MS of the mask MSK are reduced by active species of nitrogen. Thus, the clogging of the openings in the mask MSK is suppressed.

In a case where the second processing gas contains a nitrogen trifluoride gas, fluorine generated by dissociating nitrogen trifluoride causes the first region R1 and the second region R2 to be etched. However, since the amount of fluorine is reduced by bonding to hydrogen, the amount of the first region R1 and the second region R2 being etched in the step ST2 is smaller than the amount of the first region R1 and the second region R2 being etched in the step ST1. Nitrogen generated by dissociating nitrogen trifluoride contributes to adjustment of the etched amount of the mask MSK, and adjustment of the amount of hydrocarbon deposited on the mask MSK.

In a case where the second processing gas contains a carbonyl sulfide gas, a product which contains sulfur (S) generated by dissociating carbonyl sulfide is deposited on the mask MSK protects the mask MSK, and contributes to adjustment of the width of the openings in the mask MSK. In a case where the second processing gas contains a hydrocarbon gas, the hydrocarbon gas contributes as a hydrocarbon source for protecting the side wall surfaces SW.

In the method MT, after the sequence SQ including the step ST1 and the step ST2 is performed, it is determined whether or not a stop condition is satisfied in a step STJ. It is determined that the stop condition is satisfied, when the number of times of performing the sequence SQ reaches a predetermined number. In a case where, in the step STJ, it is determined that the stop condition is not satisfied, the sequence SQ is performed again from the step ST1. In a case where, in the step STJ, it is determined that the stop condition is satisfied, the method MT is ended. In this manner, in the method MT, the plurality of sequences SQ are performed, and thus, as illustrated in FIG. 7, the first region R1 and the second region R2 are etched until the spaces reaches a surface of the underlying layer UL.

As described above, in the method MT, the first region R1 and the second region R2 are etched in the step ST1. In the step ST2, the deposition DP is formed on the side wall surfaces SW which have been formed by etching. In this manner, in the method MT, since the etching of the first region R1 and the second region R2, and formation of the deposition DP for protecting the side wall surface SW are alternately performed, etching of the side wall surface SW in a horizontal direction (direction orthogonal to a film thickness direction) is suppressed. Particularly, an effect of protecting the side wall surfaces SW by the deposition DP is exhibited in the second region R2 which is easily etched in the horizontal direction by the etching in the step ST1. Thus, according to the method MT, it is possible to improve verticality of the side wall surfaces SW formed by etching.

In the method MT of one embodiment, the time length of the execution period for the step ST1 in the sequence SQ may be set to be longer than the time length of the execution period for the step ST2 in the sequence SQ. The step ST1 is used for etching the first region R1 and the second region R2, as described above. The step ST2 is mainly used for protecting the side wall surfaces SW, as described above, and contribution of the step ST2 to etching is relatively small. Accordingly, throughput in etching the first region R1 and the second region R2 is improved by setting the time length of the execution period for the step ST1 to be longer than the time length of the execution period for the step ST2.

In the method MT, since the first step and the second step are consecutively performed without providing a period for replacement of the gas during which a plasma is not generated, the throughput is improved. In addition, in the period $P_{2a}$ immediately after the execution period P1 for the step ST1 and the period $P_{2c}$ immediately before the execution period P1 for the step ST1, the ratio of the flow rate of the hydrogen gas to the flow rate of the second processing gas is set to be small. Thus, the amount of the hydrogen gas mixed into the first processing gas is reduced. As a result, reduction of the amount of fluorine generated from the first processing gas is suppressed. In addition, excessive generation of hydrocarbon and fluorine-containing hydrocarbon which may be deposited on the mask MSK is suppressed. Accordingly, reduction of the size of the openings of the mask MSK and/or clogging of the mask MSK are suppressed. Therefore, deterioration of the verticality of the side wall surfaces SW defining spaces formed in the first region R1 and the second region R2 is suppressed even when the step ST1 and the step ST2 are consecutively performed.

As described above, in one embodiment, the second processing gas further contains the nitrogen gas in the period $P_{2a}$ immediately after the execution period P1 for the step ST1 and the period $P_{2c}$ immediately before the execution period P1 for the step ST1. In this embodiment, the amount of the deposition on the mask MSK is reduced by the active species of nitrogen.

As described above, in one embodiment, the ratio of the flow rate of the oxygen gas to the flow rate of the first processing gas in the period $P_{1a}$ immediately after the execution period P2 for the step ST2 and the period $P_{1c}$ immediately before the execution period P2 for the step ST2 is set to be smaller than the ratio of the flow rate of the oxygen gas to the flow rate of the first processing gas in the period $P_{1c}$. In this embodiment, the amount of the deposition on the mask MSK can be adjusted by adjusting the time lengths of the period $P_{1a}$ and the period $P_{1c}$, and thus the width of the openings in the mask MSK can be adjusted.

As described above, in one embodiment, the first processing gas may further contain the nitrogen gas in the period $P_{1a}$ immediately after the execution period P2 for the step ST2 and the period $P_{1c}$ immediately before the execution period P2 for the step ST2. In this embodiment, the amount of the deposition on the mask MSK is reduced by the active species of nitrogen.

As described above, in one embodiment, the first processing gas may further contain the fluorine-containing gas in the period $P_{1a}$ immediately after the execution period P2 for the step ST2 and the period $P_{1c}$ immediately before the execution period P2 for the step ST2. According to this embodiment, it is possible to adjust the amount of the deposition on the mask MSK, and to increase an etching rate. In addition, it is possible to adjust the width of openings formed in the first region R1 and the second region R2.

It should be noted that an execution order of the step ST1 and the step ST2 in each of the sequences SQ is not limited to the execution order illustrated in FIG. 1. That is, in each of the sequences SQ, the step ST2 may be performed at first, and then the step ST1 may be performed.

In periods $P_{1a}$ and periods $P_{1c}$ in all of the sequences SQ, the ratio of the flow rate of the oxygen gas in the first processing gas is not necessarily set to be small. That is, in the period $P_{1a}$ immediately after the execution period P2 for the step ST2 in at least a sequence among a plurality of the sequences SQ, and the period $P_{1c}$ immediately before the execution period P2 for the step ST2 in at least a sequence among a plurality of the sequences SQ, the ratio of the flow rate of the oxygen gas in the first processing gas may be set to be small. For example, in the period $P_{1a}$ immediately after the execution period P2 for the step ST2 in one or more sequences included in the first half of the plurality of sequences SQ in an execution order or one or more sequences included in the second half of the plurality of sequences SQ in the execution order, and the period $P_{1c}$ immediately before the execution period P2 for the step ST2 in one or more sequences included in the first half of the plurality of sequences SQ in the execution order or one or more sequences included in the second half of the plurality of sequences SQ in the execution order, the ratio of the flow rate of the oxygen gas in the first processing gas may be set to be small. Similarly, in the period $P_{1a}$ immediately after the execution period P2 for the step ST2 in one or more sequences included in the first half of the plurality of sequences SQ in an execution order or one or more sequences included in the second half of the plurality of sequences SQ in the execution order, and the period $P_{1c}$ immediately before the execution period P2 for the step ST2 in one or more sequences included in the first half of the plurality of sequences SQ in the execution order or one or more sequences included in the second half of the plurality of sequences SQ in the execution order, the first processing gas may further include the nitrogen gas. Similarly, in the period $P_{1a}$ immediately after the execution period P2 for the step ST2 in one or more sequences included in the first half of the plurality of sequences SQ an execution order or one or more sequences included in the second half of the plurality of sequences SQ in the execution order, and the period $P_{1c}$ immediately before the execution period P2 for the step ST2 in one or more sequences included in the first half of the plurality of sequences SQ in the execution order or one or more sequences included in the second half of the plurality of sequences SQ in the execution order, the first processing gas may further include the fluorine-containing gas.

In the example illustrated in FIG. 4, the plasma is continuously generated over the execution period for the step ST1, and the execution period for the step ST2. That is, the high-frequency wave for generating the plasma is continuously used over the execution period for the step ST1 and the execution period for the step ST2. However, in each of the execution period for the step ST1 and the execution period for the step ST2, the plasma may be intermittently generated. That is, in each of the execution period for the seep ST1 and the execution period for the step ST2, a period in which the plasma is generated and a period in which, the plasma is not substantially generated may be alternately repeated. For example, in each of the execution period for the step ST1 and the execution period for the step ST2, a pulse-modulated high-frequency wave may be used as the high-frequency wave for generating the plasma. The high frequency bias may be pulse-modulated in synchronization with the pulse-modulated high-frequency wave, or in such a manner that the phase thereof is inverted with respect to the phase of the pulse-modulated high-frequency wave.

Figure 8:
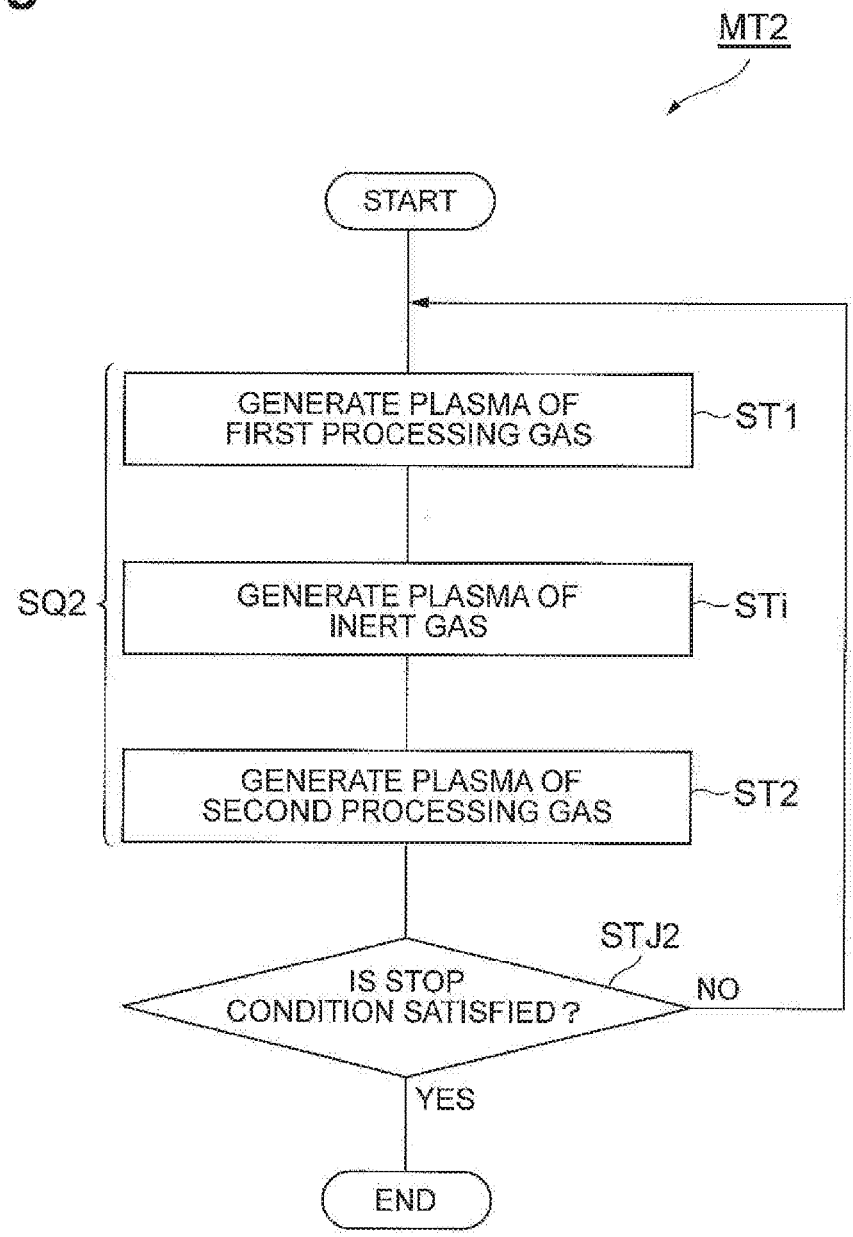
FIG. 8 is a flowchart illustrating an etching method according to another exemplary embodiment.

Hereinafter, an etching method according to another embodiment will be described. FIG. 8 is a flowchart illustrating the etching method according to another exemplary embodiment. FIG. 9 is a diagram illustrating an example of a timing chart relating to the method illustrated in FIG. 8. In FIG. 9, a horizontal axis indicates time and a vertical axis indicates the flow rate of the first processing gas, the flow rate of an inert gas, and the flow rate of the second processing gas. In FIG. 9, the vertical axis also indicates provision of the high-frequency wave. A high level in "provision of the high-frequency wave" indicates that the high-frequency wave is supplied. A low level in the "provision of the high-frequency wave" indicates that the high-frequency wave is not supplied. In the following, the difference between the method MT2 illustrated in FIG. 8 and the method MT will be described.

In the method MT2, a plurality of sequences SQ2 each of which includes a step ST1 and a step ST2 are performed in order. In the step ST1, a plasma of a first processing gas is generated in the processing container 12. The first processing gas includes a fluorocarbon gas and a hydrofluorocarbon gas, similar to the first processing gas used in the step ST1 of the method MT. The first processing gas may further include an oxygen gas.

In the step ST2, a plasma of a second processing gas is generated in the processing container 12. The second processing gas includes a hydrofluorocarbon gas and a nitrogen gas ($N_2$ gas), similar to the second processing gas used in the step ST2 of the method MT. The second processing gas further includes a hydrogen gas.

In the method MT2, each of the sequences SQ2 further includes a step STi. The step STi is performed between the step ST1 and the step ST2. The step STi is performed in an execution period Pi which is a period after the step ST1 is performed in the execution period P1, and before the step ST2 is performed in the execution period P2. In the step STi, plasma of an inert gas is generated in the processing container 12. The inert gas includes a helium gas. The inert gas may further include a nitrogen gas. The step STi may be further performed in a period after the step ST2 is performed and before the step ST1 in the subsequent sequence SQ2 is performed.

In the method MT2, it is determined whether or not a stop condition is satisfied in a step STJ2, each time after the sequence SQ2 is performed. It is determined that the stop condition is satisfied, when the number of times of performing the sequence SQ2 reaches a predetermined number. In a case where, in the step STJ2, it is determined that the stop condition is not satisfied, the sequence SQ2 is performed again from the step ST1. In a case where, in the step STJ2, it is determined that the stop condition is satisfied, the method MT2 is ended.

In each of the plurality of sequences SQ2, the step ST1, the step STi, and the step ST2 are consecutively performed. In one embodiment, a plasma is continuously generated over an execution period P1 for the step ST1, an execution period Pi for the step STi, and an execution period P2 for the step ST2. That is, a high-frequency wave for generating the plasma is continuously used over the plurality of sequences SQ2. In each of the execution period P1 for the step ST1 and the execution period P2 for the step ST2, the plasma may be intermittently generated.

In this method MT2, the first region R1 and the second region R2 are also etched by performing the step ST1, similar to the method MT1. Then, in the step ST2, deposition DP is formed on the side wall surfaces SW which are formed by etching. Thus, according to the method MT2, it is possible to improve verticality of the side wall surfaces SW formed by etching.

In the method MT2, without providing a period for replacement of a gas during which the plasma is not generated between the step ST1 and the step ST2, generation of the plasma in a state where the first processing gas and the second processing gas are mixed is prevented, by providing thee period Pi for generating the plasma of the inert gas. Accordingly, excessive generation of the deposition on the mask MSK is suppressed. Therefore, according to the method MT2, reduction of the size of the openings of the mask MSK and/or clogging of the mask is suppressed, and the verticality of the side wall surfaces formed by the etching, particularly, the side wall surface formed by etching the second region R2 is improved.

A rare gas included in the inert gas which is used in the step STi is a helium gas. The atomic weight of such a rare gas is smaller than an atomic weight of an atom of another rare gas. Thus, etching, of the mask MSK due to ions generated in the step STi is suppressed. In one embodiment, the inert gas used in the step STi contains a nitrogen gas. Thus, the amount of the deposition on the mask MSK is reduced by the active species of nitrogen. Accordingly, reduction of the size of the openings of the mask MSK and/or clogging of the mask is suppressed.

Hereinbefore, various embodiments have been described. However, various modifications may be made without being limited to the above-described embodiments. For example, the method MT and the method MT2 may be performed by using an arbitrary plasma processing apparatus, such as an inductively coupled plasma processing apparatus or a plasma processing apparatus using a surface wave such as a microwave.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of simultaneously etching a first region and a second region of a workpiece, wherein the first region includes a multi-layer film in which silicon oxide films and silicon nitride films are alternately stacked, the second region includes a silicon oxide film having a film thickness thicker than a film thickness of the silicon oxide films in the first region, and the workpiece includes a mask for providing openings on the first region and the second region, the method comprising:

a first step of generating a plasma of a first processing gas which contains a fluorocarbon gas and a hydrofluorocarbon gas, in a processing container of a plasma processing apparatus in which the workpiece is prepared; and a second step of generating a plasma of a second processing gas which contains a hydrofluorocarbon gas and a nitrogen gas, in the processing container, wherein a plurality of sequences each of which includes the first step and the second step are performed, the first step and the second step are consecutively performed, an execution period for the second step includes a first period including a start point of the second step, a second period subsequent to the first period, and a third period which is subsequent to the second period and includes an end point of the second step, the second processing gas further contains a hydrogen gas in the second period, and a ratio of a flow rate of the hydrogen gas to a flow rate of the second processing gas in the first period immediately after an execution period for the first step and the third period immediately before the execution period for the first step is set to be smaller than the ratio of the flow rate of the hydrogen gas to the flow rate of the second processing gas in the second period.

2. The method according to claim 1, wherein the second processing gas further contains a nitrogen gas in the first period immediately after the execution period for the first step and the third period immediately before the execution period for the first step.

3. The method according to claim 1, wherein the flow rate of the hydrogen gas in the first period immediately after the execution period for the first step and the third period immediately before the execution period for the first step is set to be smaller than the flow rate of the hydrogen gas in the second period.

4. The method according to claim 1, wherein an execution period for the first step includes a fourth period including a start point of the first step, a fifth period subsequent to the fourth period, and a sixth period which is subsequent to the fifth period and includes an end point of the first step, the first processing gas further contains an oxygen gas in the fifth period, and a ratio of a flow rate of the oxygen gas to a flow rate of the first processing gas in the fourth period immediately after the execution period for the second step in at least a sequence among the plurality of sequences and in the sixth period immediately before the execution period for the second step in at least a sequence among the plurality of sequences is set to be smaller than the ratio of the flow rate of the oxygen gas to the flow rate of the first processing gas in the fifth period.

5. The method according to claim 4, wherein the first processing gas further contains a nitrogen gas in the fourth period immediately after the execution period for the second step in at least a sequence among the plurality of sequences and in the sixth period immediately before the execution period for the second step in at least a sequence among the plurality of sequences.

6. The method according to claim 4, wherein the flow rate of the oxygen gas in the fourth period immediately after the execution period for the second step in at least a sequence among the plurality of sequences and in the sixth period immediately before the execution period for the second step in at least a sequence among the plurality of sequences is set to be smaller than the flow rate of the oxygen gas in the fifth period.

7. The method according to claim 4, wherein the first processing gas further contains a fluorine-containing gas in the fourth period immediately after the execution period for the second step in at least a sequence among the plurality of sequences and in the sixth period immediately before the execution period for the second step in at least a sequence among the plurality of sequences.

8. The method according to claim 1, wherein a high-frequency wave for generating plasma is continuously used over the execution period for the first step and the execution period for the second step.

9. The method according to claim 1, wherein the execution period for the first step is longer than the execution period for the second step.

10. The method according to claim 1, wherein the second processing gas further contains a nitrogen trifluoride gas.

11. The method according to claim 1, wherein the second processing gas further contains a carbonyl sulfide gas.

12. The method according to claim 1, wherein the second processing gas further contains a hydrocarbon gas.

13. The method according to claim 1, wherein the mask is formed of carbon.

14. A method of simultaneously etching a first region and a second region of a workpiece, wherein the first region includes a multi-layer film in which silicon oxide films and silicon nitride films are alternately stacked, the second region includes a silicon oxide film having a film thickness thicker than a film thickness of the silicon oxide films in the first region, and the workpiece includes a mask for providing openings on the first region and the second region, the method comprising:

a first step of generating a plasma of a first processing gas which contains a fluorocarbon gas and a hydrofluorocarbon gas, in a processing container of a plasma processing apparatus in which the workpiece is prepared; and a second step of generating a plasma of a second processing gas which contains a hydrofluorocarbon gas, a nitrogen gas, and a hydrogen gas, in the processing container, wherein a plurality of sequences each of which includes the first step and the second step are performed, each of the plurality of sequences further includes between the first step and second step an intermediate step of generating a plasma of an inert gas which contains a helium gas, in the processing container.

15. The method according to claim 14, wherein the inert gas further contains a nitrogen gas.

* * * * *